US008242875B2

(12) United States Patent
Lim et al.

(10) Patent No.: US 8,242,875 B2
(45) Date of Patent: Aug. 14, 2012

(54) THIN FILM TYPE VARISTOR AND A METHOD OF MANUFACTURING THE SAME

(75) Inventors: Jung Wook Lim, Daejeon (KR); Jun Kwan Kim, Daejeon (KR); Sun Jin Yun, Daejeon (KR); Hyun Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 210 days.

(21) Appl. No.: 12/740,624

(22) PCT Filed: Aug. 20, 2008

(86) PCT No.: PCT/KR2008/004853
§ 371 (c)(1),
(2), (4) Date: Apr. 29, 2010

(87) PCT Pub. No.: WO2009/057885
PCT Pub. Date: May 7, 2009

(65) Prior Publication Data
US 2010/0259357 A1    Oct. 14, 2010

(30) Foreign Application Priority Data

Oct. 31, 2007  (KR) .................. 10-2007-0110152
Mar. 14, 2008  (KR) .................. 10-2008-0023827

(51) Int. Cl.
*H01C 7/10* (2006.01)
(52) U.S. Cl. ................. 338/20; 338/21; 438/663
(58) Field of Classification Search ........... 338/20, 338/21, 13, 54, 224; 438/663, 104, 510
See application file for complete search history.

(56) References Cited

U.S. PATENT DOCUMENTS

| | | | |
|---|---|---|---|
| 4,320,379 A * | 3/1982 | Yodogawa | 338/21 |
| 5,464,990 A | 11/1995 | Shiratsuki et al. | |
| 5,565,838 A * | 10/1996 | Chan | 338/21 |
| 5,699,035 A * | 12/1997 | Ito et al. | 338/21 |
| 6,535,105 B2 * | 3/2003 | Heistand et al. | 338/226 |
| 7,015,787 B2 * | 3/2006 | Nakamura | 338/20 |

(Continued)

FOREIGN PATENT DOCUMENTS

JP          03-044002 A       2/1991
(Continued)

OTHER PUBLICATIONS

F. S. Mahmood et al. "D.c. properties of ZnO thin films prepared by r.f. magnetron sputtering" Thin Solid Films, vol. 270, Issues 1-2, Dec. 1, 1995, pp. 376-379.

(Continued)

*Primary Examiner* — Kyung Lee
(74) *Attorney, Agent, or Firm* — Rabin & Berdo, P.C.

(57) ABSTRACT

A thin film type varistor and a method of manufacturing the same are provided. The method includes: a depositing a first zinc oxide thin film at a low temperature through a sputtering method; and a forming a zinc oxide thin film for a varistor by treating the first zinc oxide thin film with heat at a low temperature in an environment in which an inert gas and oxygen are injected. Accordingly, it is possible to lower a processing temperature and simplify a manufacturing process while maintaining a varistor characteristic so as to be applied to a highly integrated circuit.

10 Claims, 6 Drawing Sheets

(a)

(b)

U.S. PATENT DOCUMENTS

| | | |
|---|---|---|
| 7,271,081 B2 * | 9/2007 | Li et al. .................. 438/570 |
| 2004/0175860 A1 | 9/2004 | Park et al. |
| 2005/0143262 A1 | 6/2005 | Hirose et al. |
| 2005/0202662 A1 * | 9/2005 | Joshi et al. .................. 438/585 |

FOREIGN PATENT DOCUMENTS

| | | |
|---|---|---|
| JP | 03-268401 A | 11/1991 |
| JP | 2004-140334 A | 5/2004 |
| KR | 1992-0005155 B1 | 6/1992 |
| KR | 2002-0077557 A | 10/2002 |
| KR | 2003-0078095 A | 10/2003 |
| KR | 2004-0079516 A | 9/2004 |

OTHER PUBLICATIONS

Huang Yanqiu Q. et al. "Preparation and properties of ZnO-based ceramic films-for low-voltage varistors by novel sol-gel process" Materials science & engineering. B, Solid-state materials for advanced technology, 2001, vol. 86, pp. 232-236.

* cited by examiner

[Fig. 1]
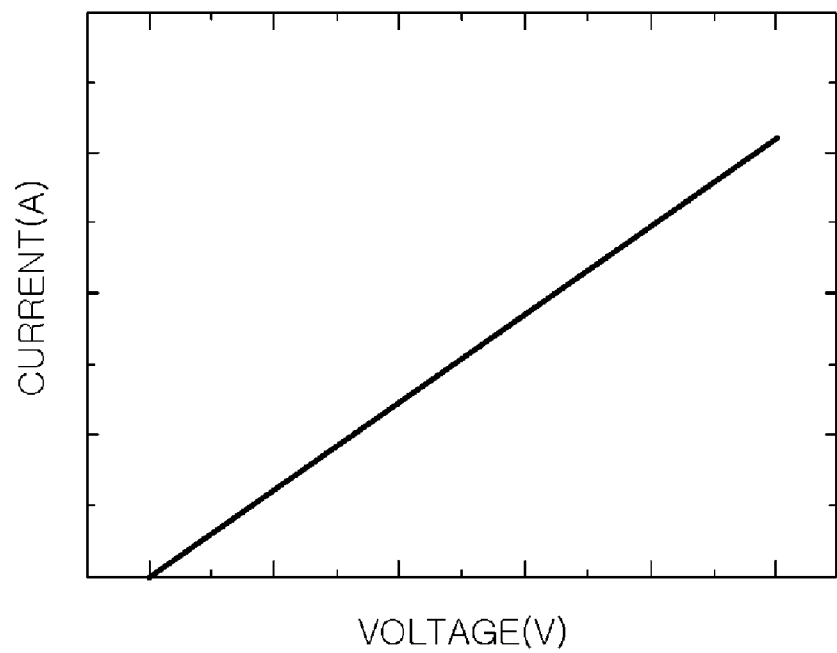

[Fig. 2]
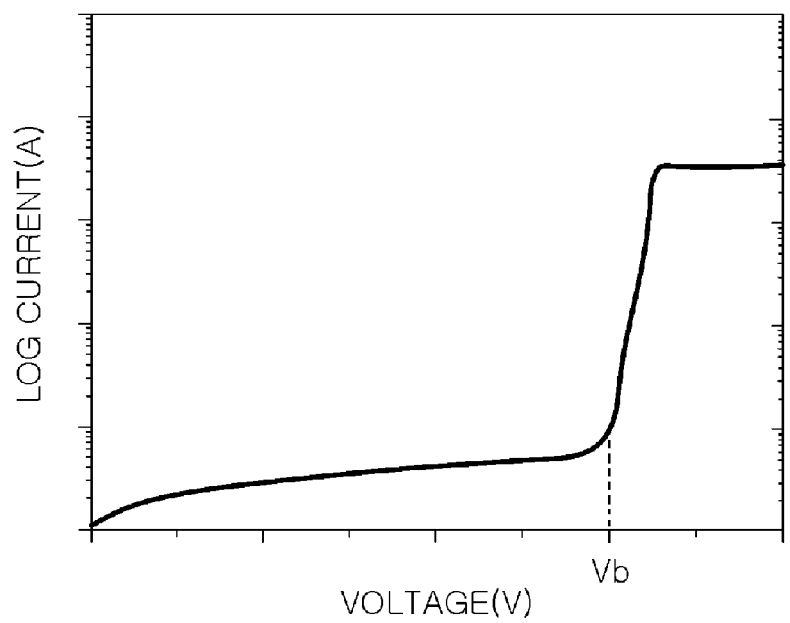

[Fig. 3]
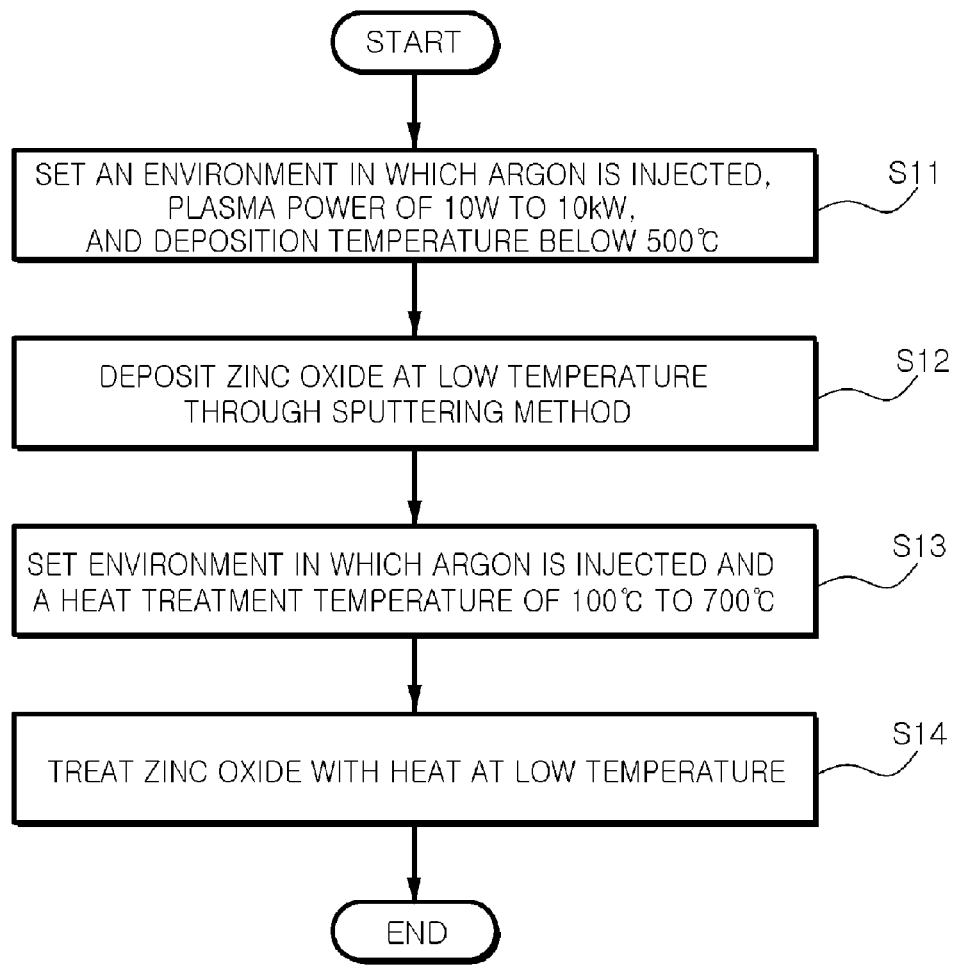

[Fig. 4]
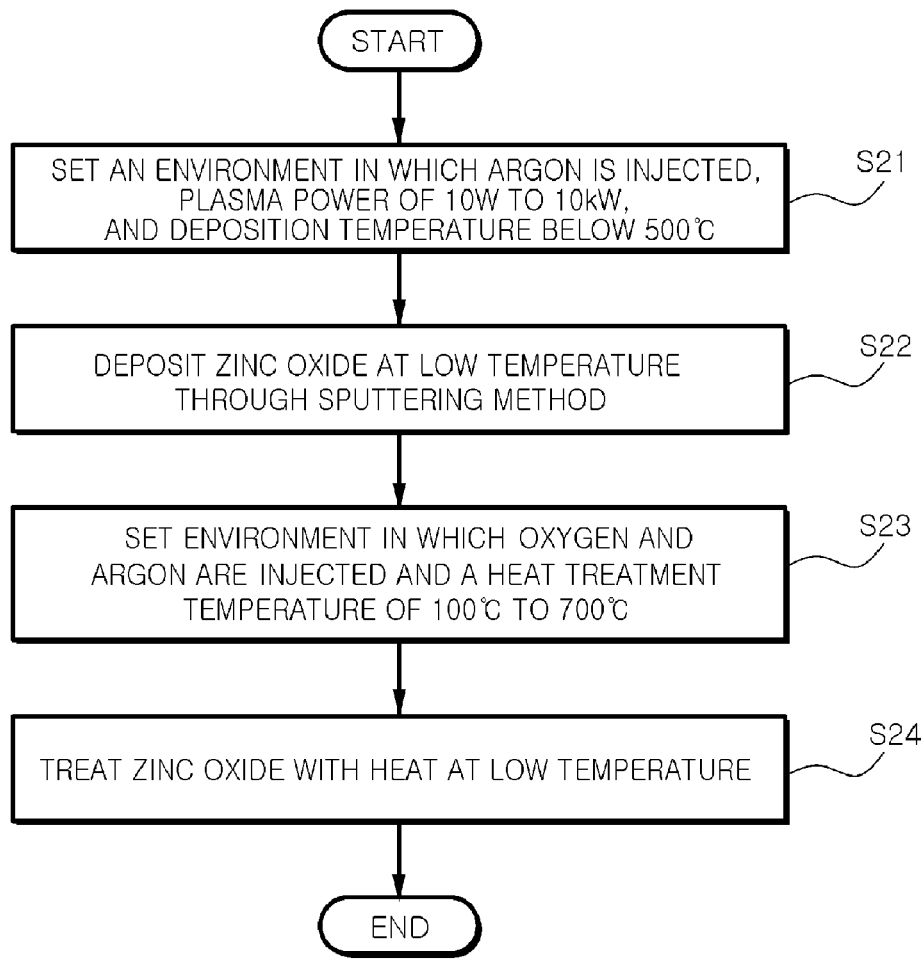

[Fig. 5]
(a)
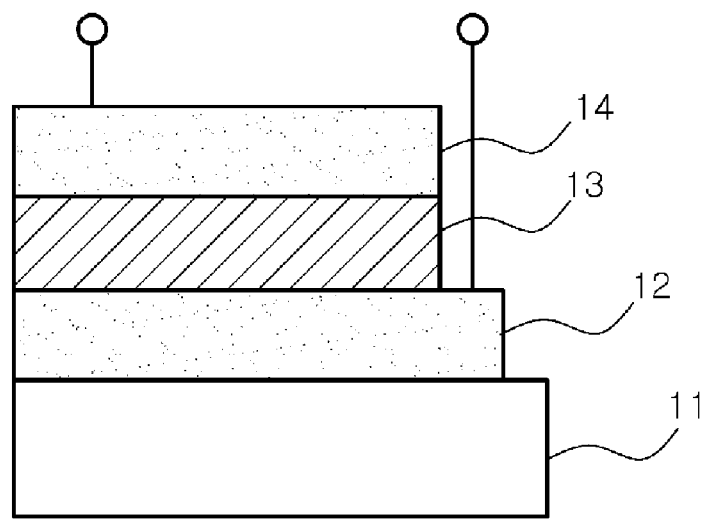
(b)
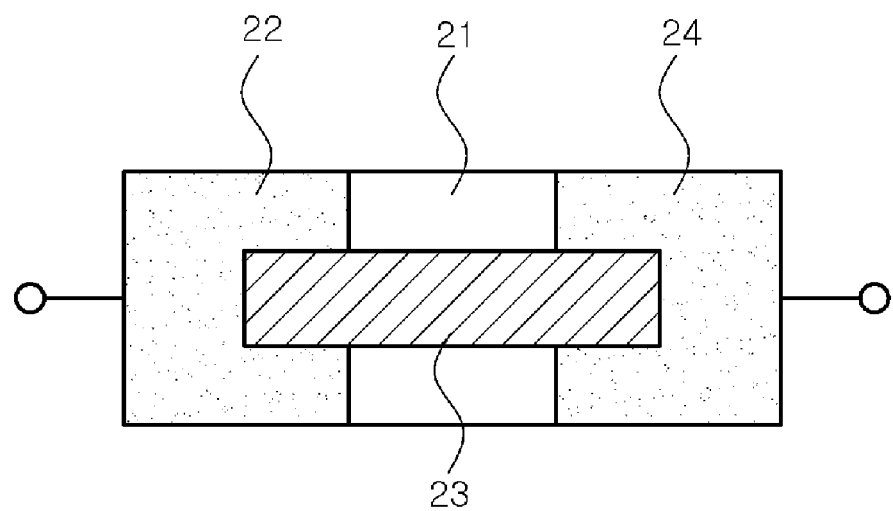

[Fig. 6]
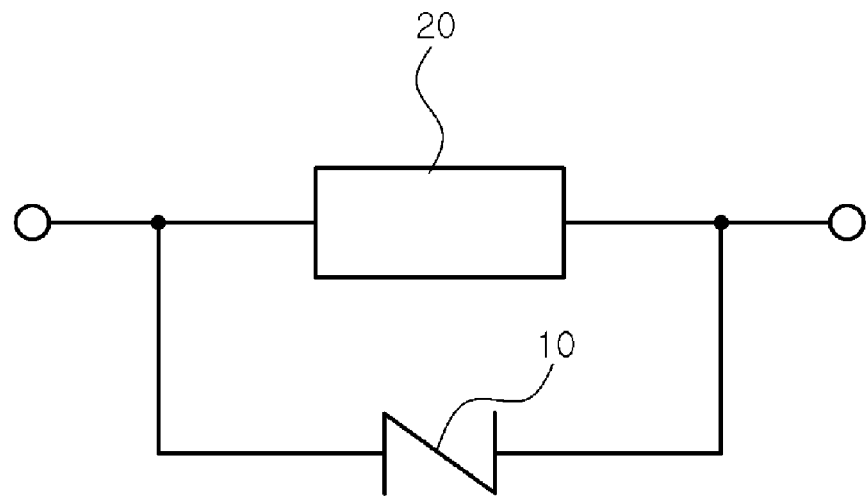

THIN FILM TYPE VARISTOR AND A METHOD OF MANUFACTURING THE SAME

TECHNICAL FIELD

The present invention relates to a varistor, and more particularly, to a thin film type varistor that is applicable to a highly integrated circuit and a method of manufacturing the same.

BACKGROUND ART

A varistor has resistance that is changed based on a change in electric field. The varistor mainly serves to protect a semiconductor element from an abrupt change in voltage.

As electronic products are minimized and light-weighted with multi-functions, semi-conductor elements that are mounted on the electronic products are also highly integrated. Accordingly, varistors for preventing the semiconductor elements from mal-functioning or breaking are also highly integrated.

As highly integrated semiconductor thin film elements with various functions are developed and used, thin film type varistors that can be mounted together with the highly integrated semiconductor thin film elements are also required to be developed.

However, it is nearly impossible to manufacture a thin film type varistor through an existing procedure of manufacturing a thick film type varistor or a bulk type varistor.

This is because a temperature at which the thick film type varistor or bulk type varistor is manufactured is too high. In general, in the existing procedure of manufacturing the thick film type varistor or bulk type varistor, a sintering temperature of 1000° C. to 1300° C. is required. However, an electrode of a thin film type varistor and a semiconductor thin film which are vulnerable to heat are broken or damaged at the aforementioned temperature.

This is also because the varistor has to contain about ten types of additives (for example, bismuth oxide ($Bi_2O_3$), praseodymium oxide ($Pr_6O_{11}$), cobalt oxide (CoO), chromium oxide ($Cr_2O_3$), mangan oxide (MnO), erbium oxide ($Er_2O_3$), and the like) so as to have a good characteristic of a thin film type varistor. However, it is very difficult to deposit a thin film of the varistor by accurately adjusting the additives in an existing method of depositing a thin film.

A currently commercialized zinc oxide based varistor is a thick film type varistor or bulk type varistor with a non-linearity coefficient equal to or greater than 50. However, when the thin film of the varistor is deposited through an existing thin film deposition method such as a sputtering deposition method, a chemical vapor deposition method (CVD), and the like, the non-linearity coefficient is rapidly decreased to a value of 3 to 22.

In order to solve this problem a bismuth based varistor to which bismuth oxide is added is suggested. However, volatility of bismuth oxide becomes very high due to a high temperature sintering process when manufacturing the bismuth based varistor. Accordingly, reproducibility of the varistor is low. The bismuth based varistor easily reacts on other oxides to produce various electrically unnecessary phases therein, thereby deteriorating characteristics thereof.

DISCLOSURE OF INVENTION

Technical Problem

The present invention provides a thin film type varistor with a good varistor characteristic, which has a low processing temperature and a simple manufacturing procedure so as to be applied to a highly integrated circuit.

Technical Solution

According to an aspect of the present invention, there is provided a method of manufacturing a thin film type varistor, the method comprising: a depositing a first zinc oxide thin film at a low temperature through a sputtering method; and a forming a zinc oxide thin film for a varistor by treating the first zinc oxide thin film with heat at a low temperature in an environment in which inert gas and oxygen are injected In the above aspect of the present invention, the aforementioned method may further comprise: forming a zinc oxide thin film for a lower metal electrode by depositing a second zinc oxide thin film at a low temperature through the sputtering method so as to be located between a substrate and the zinc oxide thin film for the varistor before the depositing first zinc oxide and the forming a zinc oxide thin film for a varistor and treating the second zinc oxide thin film with heat at a low temperature in an environment in which only the inert gas is injected; and forming a zinc oxide thin film for an upper metal electrode by depositing a third zinc oxide thin film at a low temperature through the sputtering method so as to be located on the zinc oxide thin film for the varistor after the depositing first zinc oxide and the forming a zinc oxide thin film for a varistor and treating the third zinc oxide thin film with heat at a low temperature in an environment in which only the inert gas is injected.

In addition, a plasma power applied when the zinc oxide thin film for the varistor is deposited may be lower than that applied when the zinc oxide thin films for the lower and upper metal electrodes are deposited.

In addition, the first to third zinc oxide thin films are deposited at a temperature below 500° C. in a state where oxygen is not injected and treated with heat at a temperature of 100° C. to 700° C.

According to another aspect of the present invention, there is provided a thin film type varistor comprising a zinc oxide thin film for a varistor which is formed by being deposited at a low temperature through a sputtering method and treated with heat at a low temperature in an environment in which inert gas and oxygen are injected.

In the above aspect of the present invention, the thin film type varistor may further comprise zinc oxide thin films for upper and lower metal electrodes which are respectively formed on and under the zinc oxide thin film for the varistor by being deposited at a low temperature through the sputtering method and treated with heat at a low temperature in an environment in which only the inert gas is injected.

In addition, a plasma power applied when the zinc oxide thin film for the varistor is deposited may be lower than that applied when the zinc oxide thin films for the lower and upper metal electrodes are deposited.

In addition, the zinc oxide thin films for the upper and lower metal electrodes and the zinc oxide thin film for the varistor are deposited at a temperature below 500° C. in a state where oxygen is not injected and treated with heat at a temperature of 100° C. to 700° C.

Advantageous Effects

In the thin film type varistor according to an embodiment of the present invention and the method of manufacturing the same, a zinc oxide thin film is deposited and treated with heat at a low temperature below 700° C. so that a thin film type varistor vulnerable to heat is stably formed.

In addition, since it is possible to deposit a zinc oxide thin film by applying a sputtering deposition method that is an existing thin film deposition method by allowing the thin film type varistor to have a high non-linearity coefficient without an additional procedure of injecting additives, a procedure of manufacturing the thin film type varistor becomes simple.

In addition, it is possible to diversify fields to which the zinc oxide thin film is applied by allowing an electrical characteristic of the zinc oxide thin film to be changed by adjusting a deposition condition and a heat treatment condition.

BRIEF DESCRIPTION OF THE DRAWINGS

FIG. 1 illustrates an electrical characteristic of a zinc oxide thin film that is manufactured under a first manufacturing condition.

FIG. 2 illustrates an electrical characteristic of a zinc oxide thin film that is manufactured under a second manufacturing condition.

FIG. 3 is a flowchart of a procedure of manufacturing a zinc oxide thin film for a metal electrode according to an embodiment of the present invention.

FIG. 4 is a flowchart of a procedure of a zinc oxide thin film for a varistor according to an embodiment of the present invention.

FIGS. 5a and b illustrate structures of thin film type varistors according to an embodiment of the present invention.

FIG. 6 illustrates an example to which a varistor is applied according to an embodiment of the present invention.

BEST MODE FOR CARRYING OUT THE INVENTION

The present invention will now be described more fully with reference to the accompanying drawings, in which exemplary embodiments of the invention are shown. In the description of the present invention, if it is determined that a detailed description of commonly-used technologies or structures related to the invention may unnecessarily obscure the subject matter of the invention, the detailed description will be omitted.

In addition, like reference numerals in the drawings denote like elements throughout the specification.

An electrical characteristic of a zinc oxide thin film, which is varied based on a manufacturing condition employed in the present invention, will be described before describing an embodiment of the present invention.

FIG. 1 illustrates an electrical characteristic of a zinc oxide thin film that is manufactured under a first manufacturing condition. In the first manufacturing condition, the zinc oxide thin film is deposited at a low temperature below 500° C. through a sputtering method in a state where oxygen is not injected and treated with heat at a low temperature below 700° C. in an environment in which only inert gas is injected.

As shown in FIG. 1, the zinc oxide thin film manufactured according to the first manufacturing condition has a conduction current which linearly increases in proportion to a voltage applied thereto. That is, since the zinc oxide thin film manufactured under the first manufacturing condition has the same electrical characteristic as metal, the zinc oxide thin film manufactured under the first manufacturing condition may be used for a metal electrode.

In the present invention, examples of the inert gas include argon (Ar) gas, helium (He) gas, neon (Ne) gas, krypton (Kr) gas, xenon (Xe) gas, radon (Rn) gas, and the like. Hereinafter, argon (Ar) gas is employed as a typical example of the inert gas.

FIG. 2 illustrates an electrical characteristic of a zinc oxide thin film that is manufactured under a second manufacturing condition. In the second manufacturing condition, the zinc oxide thin film is deposited at a low temperature through the sputtering method and treated with heat at a low temperature in an environment in which oxygen and the inert gas are mixed and injected.

As shown in FIG. 2, the zinc oxide thin film manufactured according to the second manufacturing condition has a non-linear electrical characteristic in which the zinc oxide thin film has an insulator characteristic when a voltage lower than a varistor voltage Vb is applied and the conduction current of the zinc oxide thin film is rapidly increased and stabilized when a voltage equal to or greater than the varistor voltage Vb is applied.

That is, the zinc oxide thin film manufactured according to the second manufacturing condition has a varistor characteristic in which the zinc oxide thin film is turned on when the varistor voltage Vb is applied.

The zinc oxide thin film of FIG. 2 has a varistor voltage Vb of 80 V to 100 V, a non-linearity coefficient of 20 to 25, and a leakage current equal to or less than 1 $\mu A/cm^2$. As the zinc oxide thin film is repeatedly used, the varistor characteristic of the zinc oxide thin film is stabilized.

In addition, as the plasma power applied when the zinc oxide thin film is manufactured is lowered, the varistor characteristic is improved. The plasma power applied when the zinc oxide thin film to be used for a varistor is deposited may be lower than that applied when the zinc oxide thin film to be used for a metal electrode is deposited.

Data on the electrical characteristic suggested in FIGS. 1 and 2 is an example. The electrical characteristic may not be limited to the data. The electrical characteristic may be changed based on a length and a width of a pattern of the zinc oxide thin film and an interval with an electrode.

FIG. 3 is a flowchart of a procedure of manufacturing a zinc oxide thin film for a metal electrode according to an embodiment of the present invention.

First, a condition for depositing the zinc oxide thin film for the metal electrode is set. That is, the condition is set so that oxygen is not injected, only argon (Ar) gas is injected, a plasma power of 10 W to 10 kW is applied, and a deposition temperature ranges from a normal temperature to 500° C. (operation S11).

Then, a substrate on which zinc oxide is to be deposited is positioned in a vacuum chamber. A zinc oxide thin film is deposited on the substrate through a sputtering method by flowing the argon (Ar) gas and applying a direct current (DC) source voltage to a target material (that is, zinc oxide) (operation S12).

When operation S12 is completed, a condition for treating the zinc oxide thin film for the metal electrode with heat is set. That is, the condition is set so that only argon (Ar) gas is injected, a plasma power of 10 W to 10 kW is applied, and a heat treatment temperature ranges from 100° C. to 700° C. (operation S13).

The zinc oxide thin film having the same electrical characteristic as that of FIG. 2 is formed by treating the zinc oxide thin film with heat at a low temperature according to the condition (operation S14).

At this time, a heat treatment method at a low temperature includes an in-situ method in which a heat treatment process is performed in a growth chamber by not breaking a vacuum state after the zinc oxide thin film is deposited and an ex-situ method in which the zinc oxide thin film is taken out of the chamber after the zinc oxide thin film is deposited and the heat treatment process is performed in another chamber that is different from the chamber in which the deposition process is performed. Heat may be supplied by using resistors or supplied through radiation of a lamp.

FIG. 4 is a flowchart of a procedure of a zinc oxide thin film for a varistor according to an embodiment of the present invention.

First, a condition for depositing the zinc oxide thin film for the varistor is set. That is, the condition is set so that oxygen is not injected, only argon (Ar) gas is injected, a plasma power of 10 W to 10 kW is applied, and a deposition temperature ranges from a normal temperature to 500° C. (operation S21).

At this time, the plasma power may be lower than that used to manufacture the zinc oxide thin film for the metal electrode.

Then, a substrate on which zinc oxide is to be deposited is positioned in a vacuum chamber. A zinc oxide thin film is deposited on the substrate through a sputtering method by flowing the argon (Ar) gas and applying a direct current (DC) source voltage to a target material (that is, zinc oxide) (operation S22).

Preferably, the zinc oxide thin film may be deposited to a thickness of about 10 nm to 10 µm.

When operation S22 is completed, a condition for treating the zinc oxide thin film for the varistor with heat is set. That is, the condition is set so that oxygen and argon (Ar) gas are injected, a plasma power of 10 W to 10 kW is applied, and a heat treatment temperature ranges from 100° C. to 700° C. (operation S23).

The zinc oxide thin film having the same electrical characteristic as that of FIG. 1 is formed by treating the zinc oxide thin film with heat at a low temperature according to the aforementioned heat treatment condition (operation S24).

As shown in FIGS. 3 and 4, since the zinc oxide thin film for the varistor and the zinc oxide thin film for the electrode are deposited and treated with heat at a low temperature, elements constructed with the zinc oxide thin film may be previously prevented from being broken or damaged. In addition, an additional procedure of injecting additives is not necessary.

The electrical characteristic of the zinc oxide thin film is variously changed by adjusting a ratio and a partial pressure of the injected gas and the plasma power.

In addition, although additional additives are not injected in the aforementioned description, one or two types of additives may be injected if necessary.

FIG. 5 illustrates structures of thin film type varistors according to an embodiment of the present invention. Zinc oxide thin films 12 and 22 for lower metal electrodes and zinc oxide thin films 14 and 24 for upper metal electrodes are formed according to the aforementioned manufacturing process of FIG. 3. Zinc oxide thin films 13 and 23 for varistors are formed according to the manufacturing process of FIG. 4.

A varistor shown in (a) of FIG. 5 has a serial structure. The varistor includes a substrate 11, a zinc oxide thin film 12 for a lower metal oxide which is formed on the substrate 11, a zinc oxide thin film 13 for the varistor which is formed on the zinc oxide thin film 12 for the lower metal electrode, and a zinc oxide thin film 14 for an upper metal electrode which is formed on the zinc oxide thin film 13.

On the contrary, a varistor shown in (b) of FIG. 5 has a parallel structure. The varistor includes a substrate 21, zinc oxide thin films 22 and 24 for lower and upper metal electrodes which are spaced apart from each other on the substrate 21, a zinc oxide thin film 23 for the varistor which commonly contacts the zinc oxide thin films 22 and 24 for the lower and upper metal electrodes on the zinc oxide thin films 22 and 24 for the lower and upper metal electrodes.

As shown in FIG. 5, the varistor according to the embodiment may have various structures.

In the aforementioned embodiments, the metal electrode of the varistor is embodied by using the zinc oxide thin film. The metal electrode may be made of a material selected from the group consisting of aluminum (Al), silver (Ag), platinum (Pt), gold (A), copper (Cu), iron (Fe), titanium (Ti), molybdenum (Mo), chromium (Cr), tungsten (W), titanium nitride (TiN), tungsten nitride (WN), indium tin oxide (ITO), iridium (Ir) and iridium oxide, ruthenium (Ru) and ruthenium oxide, and aluminum zinc oxide (AlZnO).

FIG. 6 illustrates an example to which a varistor is applied according to an embodiment of the present invention. Referring to FIG. 6, a varistor 10 is connected to an electronic element 20 in parallel.

Accordingly, when a rated voltage is applied to the electronic element 20, the varistor 10 according to the embodiment allows a current to flow only through the electronic element 20 by maintaining a turn-off state of the varistor 10. When an overvoltage is applied to both ends of the electronic element 20, the varistor 10 is turned on, thereby dispersing a current flow.

That is, when the overvoltage is applied, the varistor 10 provides a current path for dispersing the current flow, thereby preventing the electronic element 20 from being broken or from malfunctioning due to the overvoltage.

While the present invention has been particularly shown and described with reference to exemplary embodiments thereof it will be understood by those skilled in the art that various changes in form and details may be made therein without departing from the spirit and scope of the present invention as defined by the appended claims.

The invention claimed is:

1. A method of manufacturing a thin film type varistor, the method comprising:
   depositing a first zinc oxide thin film at a low temperature through a sputtering method; and
   forming a zinc oxide thin film for a varistor by treating the first zinc oxide thin film with heat at a low temperature in an environment in which inert gas and oxygen are injected together,
   the method further comprising:
   before the depositing a first zinc oxide and the forming a zinc oxide thin film for a varistor, forming a zinc oxide thin film for a lower metal electrode by depositing a second zinc oxide thin film at a low temperature through the sputtering method so as to be located between a substrate and the zinc oxide thin film for the varistor and treating the second zinc oxide thin film with heat at a low temperature in an environment in which only the inert gas is injected; and
   after the depositing a first zinc oxide and the forming a zinc oxide thin film for a varistor, forming a zinc oxide thin film for an upper metal electrode by depositing a third zinc oxide thin film at a low temperature through the sputtering method so as to be located on the zinc oxide thin film for the varistor and treating the third zinc oxide thin film with heat at a low temperature in an environment in which only the inert gas is injected.

2. The method of claim 1, wherein a plasma power applied when the zinc oxide thin film for the varistor is deposited is lower than that applied when the zinc oxide thin films for the lower and upper metal electrodes are deposited.

3. The method of claim 1, wherein the first to third zinc oxide thin films are deposited at a low temperature in a state where oxygen is not injected.

4. The method of claim 1, wherein the first to third zinc oxide thin films are deposited at a temperature below 500° C.

5. The method of claim 1, wherein the first and third zinc oxide thin films are treated with heat at a temperature of 100° C. to 700° C.

6. A thin film type varistor comprising
a zinc oxide thin film for a varistor which is formed by being deposited at a low temperature through a sputtering method and treated with heat at a low temperature in an environment in which inert gas and oxygen are injected,
the thin film type varistor further comprising
zinc oxide thin films for upper and lower metal electrodes which are respectively formed on and under the zinc oxide thin film for the varistor by being deposited at a low temperature through the sputtering method and treated with heat at a low temperature in an environment in which only the inert gas is injected.

7. The thin film type varistor of claim 6, wherein a plasma power applied when the zinc oxide thin film for the varistor is deposited is lower than that applied when the zinc oxide thin films for the lower and upper metal electrodes are deposited.

8. The thin film type varistor of claim 6, wherein the zinc oxide thin films for the upper and lower metal electrodes and the zinc oxide thin film for the varistor are deposited at a low temperature in a state where oxygen is not injected.

9. The thin film type varistor of claim 6, wherein the zinc oxide thin films for the upper and lower metal electrodes and the zinc oxide thin film for the varistor are deposited at a temperature below 500° C.

10. The thin film type varistor of claim 6, wherein the zinc oxide thin films for the upper and lower metal electrodes and the zinc oxide thin film for the varistor are treated with heat at a temperature of 100° C. to 700° C.

* * * * *